(12) United States Patent
Mutter et al.

(10) Patent No.: US 12,355,585 B2
(45) Date of Patent: Jul. 8, 2025

(54) SUBSCRIBER STATION FOR A SERIAL BUS SYSTEM, AND METHOD FOR COMMUNICATION IN A SERIAL BUS SYSTEM

(71) Applicant: Robert Bosch GmbH, Stuttgart (DE)

(72) Inventors: Arthur Mutter, Neuhausen (DE); Florian Hartwich, Reutlingen (DE); Franz Bailer, Moessingen (DE); Christian Horst, Dusslingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 147 days.

(21) Appl. No.: 18/040,243

(22) PCT Filed: Jul. 15, 2021

(86) PCT No.: PCT/EP2021/069742
§ 371 (c)(1),
(2) Date: Mar. 2, 2023

(87) PCT Pub. No.: WO2022/028843
PCT Pub. Date: Feb. 10, 2022

(65) Prior Publication Data
US 2024/0267255 A1    Aug. 8, 2024

(30) Foreign Application Priority Data
Aug. 5, 2020  (DE) .................. 10 2020 209 917.0

(51) Int. Cl.
*H04L 12/40* (2006.01)
*H03K 7/08* (2006.01)
*H04J 3/06* (2006.01)

(52) U.S. Cl.
CPC ........ *H04L 12/40013* (2013.01); *H03K 7/08* (2013.01); *H04J 3/0658* (2013.01)

(58) Field of Classification Search
CPC ..... H04L 12/40013; H04L 2012/40215; H04L 2012/40273; H03K 7/08; H04J 3/0658
See application file for complete search history.

(56) References Cited

U.S. PATENT DOCUMENTS 6,111,888 A *  8/2000  Green .............. H04L 12/40026
                                                    370/461
8,111,699 B2 *  2/2012  Hu ....................... H04M 11/062
                                                    370/473

(Continued)

FOREIGN PATENT DOCUMENTS

| DE | 102011122845 A1 | 1/2013 |
| DE | 102018221958 A1 | 6/2020 |
| JP | 2013538025 A    | 10/2013 |

OTHER PUBLICATIONS

ISO 11898-1:2015 Standard, "Road Vehicles—Controller Area Network (CAN)—Part 1: Data Link Layer and Physical Signalling," 2015.

(Continued)

*Primary Examiner* — Mounir Moutaouakil
(74) *Attorney, Agent, or Firm* — NORTON ROSE FULBRIGHT US LLP

(57) ABSTRACT

A subscriber station for a serial bus system. The subscriber station has a communication control device for controlling a communication of the subscriber station with at least one other subscriber station of the bus system. The communication control device generates a transmit signal according to a frame and inserts a field having an edge into the frame after a second communication phase. The field has, before the edge, a predetermined length corresponding to a time period that is longer than the time period of a bit time of a first communication phase. The edge is provided for synchronization to the communication on the bus for a communication control device of the at least one other subscriber (Continued)

station of the bus system whose transceiver device is switched, before the predetermined time period, into an operating mode for transmitting and receiving the frame in the first communication phase.

15 Claims, 6 Drawing Sheets

(56) References Cited

U.S. PATENT DOCUMENTS

| | | | | |
|---|---|---|---|---|
| 9,967,106 | B2* | 5/2018 | Chin | H04L 12/185 |
| 10,090,996 | B2* | 10/2018 | Ito | H04L 12/40143 |
| 10,367,709 | B2* | 7/2019 | Lee | H04L 12/40 |
| 11,012,254 | B2* | 5/2021 | Moodliar | H04L 12/40 |
| 11,750,416 | B2* | 9/2023 | Mutter | H04L 12/40084 |
| | | | | 370/447 |
| 11,831,465 | B2* | 11/2023 | Mutter | H04L 12/413 |
| 11,838,146 | B2* | 12/2023 | Mutter | H04L 17/30 |
| 2005/0083954 | A1* | 4/2005 | Meyer-Grafe | H04L 12/403 |
| | | | | 370/403 |
| 2022/0070020 | A1* | 3/2022 | Mutter | H04L 12/40071 |
| 2022/0209986 | A1* | 6/2022 | Mutter | H04L 12/4015 |

OTHER PUBLICATIONS

International Search Report for PCT/EP2021/069742, Issued Oct. 27, 2021.

* cited by examiner

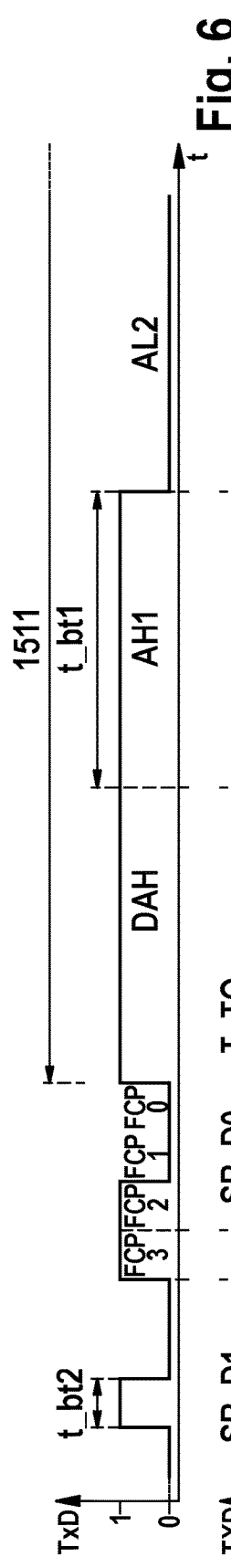
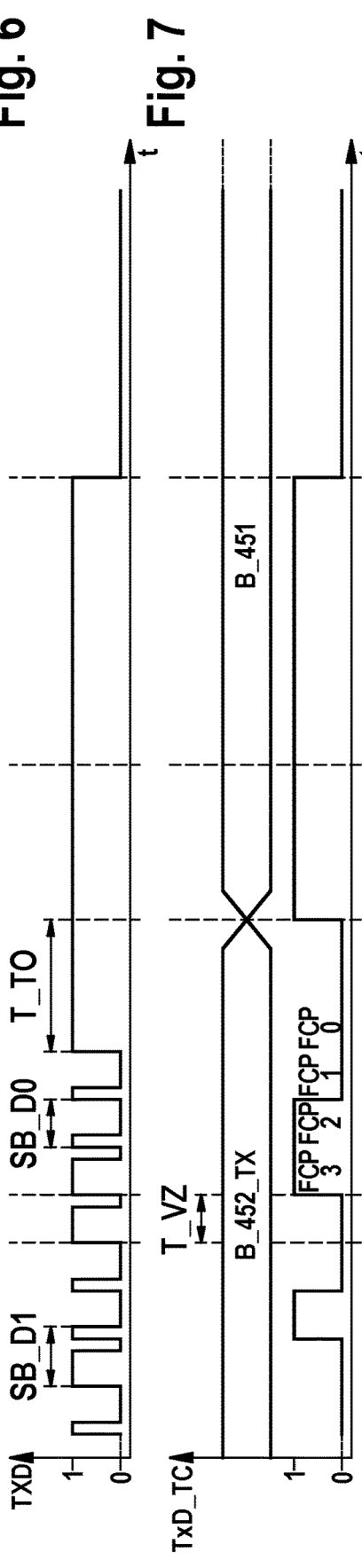
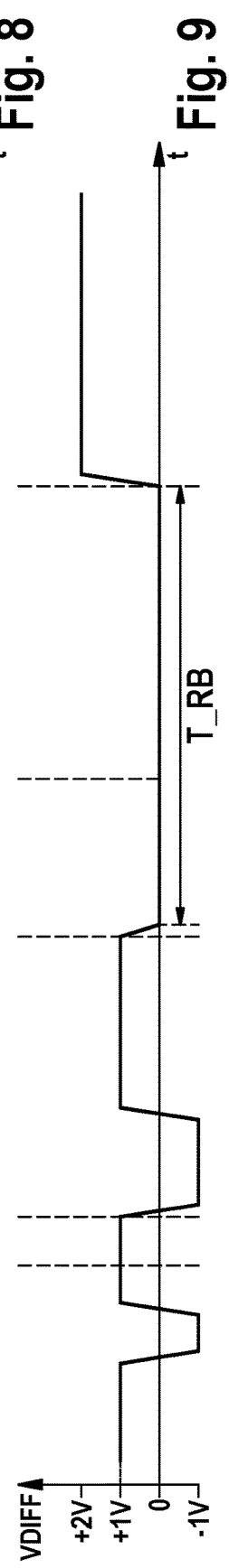
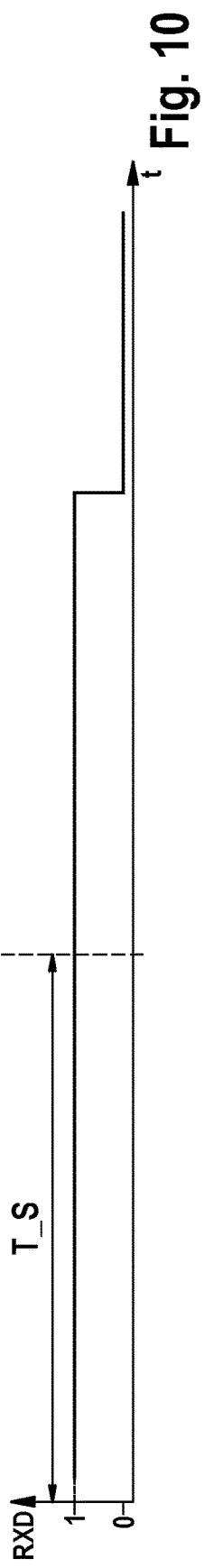

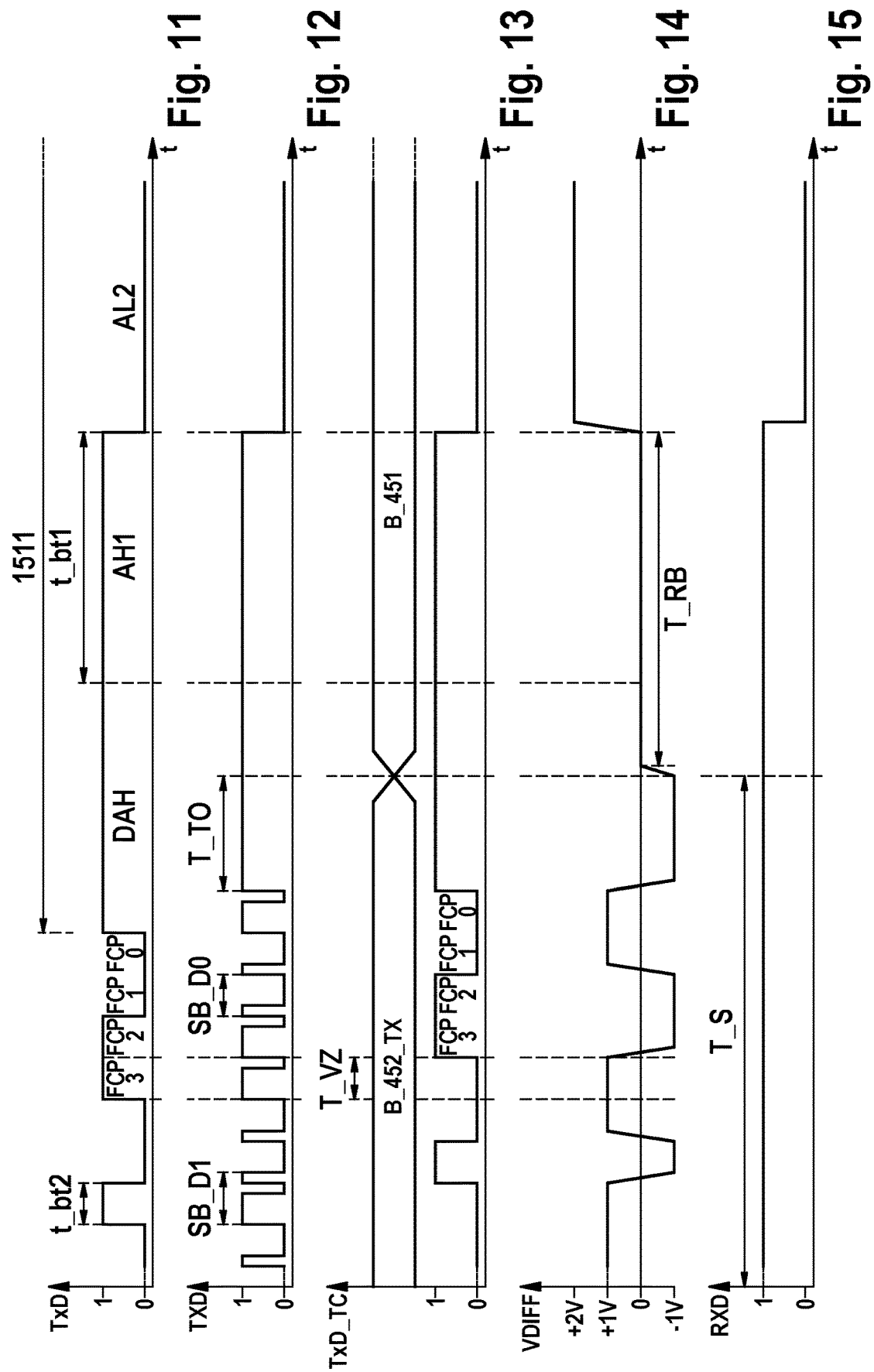

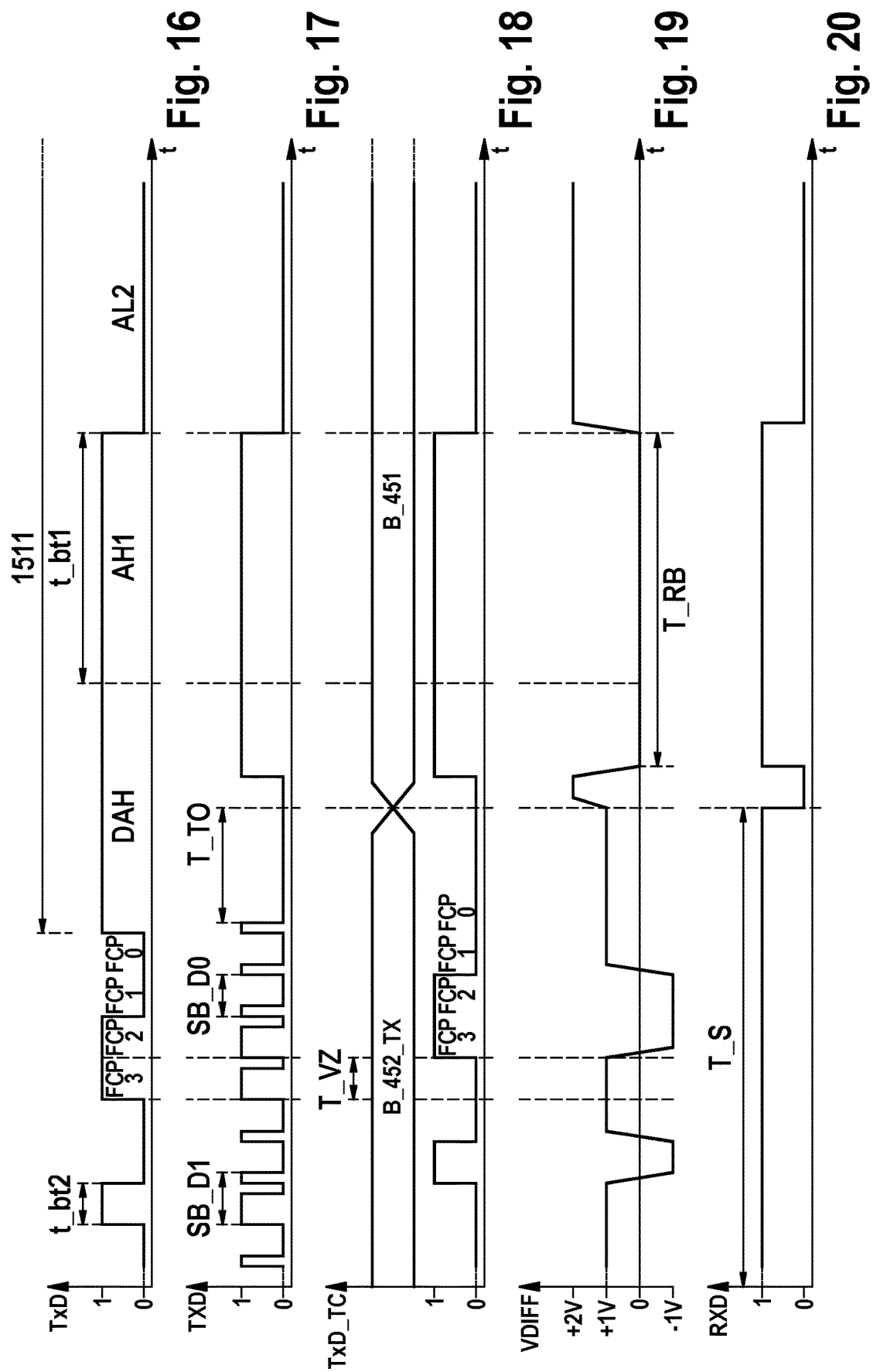

SUBSCRIBER STATION FOR A SERIAL BUS SYSTEM, AND METHOD FOR COMMUNICATION IN A SERIAL BUS SYSTEM

FIELD

The present invention relates to a subscriber station for a serial bus system and to a method for communication in a serial bus system that operates with a high data rate and with great flexibility and great error robustness.

BACKGROUND INFORMATION

Bus systems for communication between sensors and control devices, for example in vehicles, are intended to enable the transmission of a large amount of data, depending on the number of functions of a technical system or vehicle. In this context, it is often required that the data is transmitted from the sender to the receiver faster than was previously the case, and that large data packets also be transferable as needed.

For vehicles, a bus system is currently in the introduction phase in which data are transmitted as messages in the ISO 11898-1:2015 standard as a CAN protocol specification with CAN FD. The messages are transmitted between the bus subscribers of the bus system, such as sensor, control device, encoder, etc. For this purpose, the message is sent on the bus in a frame in which switching takes place between two communication phases. In the first communication phase (arbitration), it is negotiated which of the subscriber stations of the bus system is permitted to send its frame to the bus in the subsequent second communication phase (data phase, or sending of useful data). CAN FD is used by most manufacturers in the first step, with 500 kbit/s arbitration bit rate and 2 Mbit/s data bit rate in the vehicle. It is therefore necessary to switch back and forth between a slow operating mode and a fast operating mode during transmission on the bus.

To enable even higher data rates in the second communication phase, a successor bus system to CAN FD is currently being developed, called CAN XL, which is currently being standardized at the organization CAN in Automation (CiA). In addition to pure data transport via the CAN bus, CAN XL is also intended to support other functions such as functional safety, data security, and quality of service (QOS). These are elementary properties that are required in an autonomously driving vehicle.

Errors may occur when transmitting data in a frame via a channel (CAN bus). In particular, external influences, in particular irradiation, can falsify a bit. The communication protocol of CAN XL has to detect errors and react to them.

In CAN XL, the error can be handled either with or without error signaling. For error signaling, a subscriber station that detects an error sends an error frame (error flag) to the bus in order to inform the other subscriber stations that an error has been detected. Without error signaling, a subscriber station that detects an error does not send an error frame (error flag) to the bus. Thus, the transmitting subscriber station (sending node) does not receive any report back from the subscriber station, which only receives (receiving node), and which could not receive the frame correctly. This type of communication is also called "fire and forget," which can also be described as sending and forgetting.

If no error frame is sent to the bus, the transmitting subscriber station (sending node) sends the complete frame to the bus, since the feedback about the error is missing. Receiving subscriber stations (receiving nodes) that were not able to receive the frame correctly switch their transceiver back from the fast operating mode (FAST) to the slow operating mode (SLOW), if the transceiver was not already in the slow mode before, and then try to reintegrate into the running communication on the bus. As a result, these subscriber stations wait for a sequence of 11 recessive bits in a row, the so-called bus idle sequence, which can only occur at the end of a frame.

Subscriber stations that are newly switched on or are switched active again after being switched inactive and that subsequently want to participate in the communication in the bus also wait for this sequence.

Here it is important that all subscriber stations integrating into the communication complete the recognition of the 11 recessive bits at the end of a frame quasi-simultaneously. This synchrony is necessary because all subscriber stations must be simultaneously ready to transmit or receive a frame in the following bit, i.e. the bit that follows the 11 recessive bits.

To achieve this synchrony of the subscriber stations, there is a synchronization edge in a DAS field in the CAN XL frame, to which edge all receiving nodes are to synchronize. After this, the reintegration can take place synchronously.

However, it is problematic if all receiving nodes have seen an error during the data phase. In this case, none of the receiving nodes sends a dominant ACK bit as confirmation of a correct reception of the frame. As a result, the synchronization edge in the DAS field is the last possible edge for a synchronization before the bus idle sequence. Here it has turned out that with the DAS field in the current CAN XL frame format, a correct synchronization is not possible under all circumstances.

SUMMARY

It is an object of the present invention to provide a subscriber station for a serial bus system and a method for communication in a serial bus system which solve the problems described above. In particular, according to the present invention, a subscriber station for a serial bus system and a method for communication in a serial bus system are to be provided, in which the reintegration of a receiving node after an error or after being switched on during running bus communication can always take place correctly, in order also to realize a high error robustness of the communication even at a high data rate and an increase in the amount of user data per frame.

The object may be solved by a subscriber station for a serial bus system having features of the present invention. According to an example embodiment of the present invention, the subscriber station has a communication control device for controlling a communication of the subscriber station with at least one other subscriber station of the bus system such that for a message exchanged between subscriber stations of the bus system the bit time of a signal transmitted to the bus in the first communication phase may be different from a bit time of a signal transmitted in the second communication phase, and a transceiver device for transmitting the transmit signal to a bus of the bus system, the communication control device being designed to generate the transmit signal according to a frame and to insert a field having an edge into the frame after the second communication phase, the field having, before the edge, a predetermined length corresponding to a time period that is longer than the time period of a bit time of the first communication phase, and the edge being provided for synchronization to the communication on the bus for a communication control device of the at least one other subscriber station of the bus system whose transceiver device is switched, before the predetermined time period, into an operating mode for transmitting and receiving the frame in the first communication phase.

Due to the design of the subscriber station, there is a modified DAS field that ensures that all subscriber stations re-integrating into the communication on the bus can synchronize in the DAS field. This enables a safe error handling even in case of errors due to irradiation. Furthermore, fairness is ensured because all subscriber stations (nodes) are ready to transmit or receive again at the same time. In addition, subsequent errors during communication in the bus system can be avoided in this way.

In this way, robust communication with the subscriber station with CAN XL is first made possible.

Thus, with the subscriber station in the bus system, it is possible to maintain an arbitration from CAN in a first communication phase and nonetheless to again significantly increase the transmission rate compared to CAN or CAN FD.

The method carried out by the subscriber station can also be used if there is also at least one CAN subscriber station and/or at least one CAN FD subscriber station in the bus system that send messages according to the CAN protocol and/or CAN FD protocol.

Advantageous further embodiments of the subscriber station are disclosed herein.

It is possible for the predetermined length of the field to have at least three bits with the bit time of the first communication phase.

The edge can be a falling edge.

The communication control device can be designed to insert the bit sequence with the logical value 11 in the field before the edge.

The communication control device can be designed to insert the field as a bit sequence having the logical value 1101.

According to an exemplary embodiment of the present invention, the communication control device is designed to signal to the transceiver device by pulse width modulation in the transmit signal that the transceiver device has to switch its operating mode.

It is possible for the subscriber station to also have the transceiver device for transmitting the transmit signal to a bus of the bus system, the transceiver device being designed to switch its operating mode from the operating mode of the second communication phase to the different operating mode of the first communication phase after a predetermined time period has elapsed in which the transceiver device has not received any edges in the transmit signal.

According to an exemplary embodiment of the present invention, the communication control device is configured to insert a PWM symbol with the logical value 0 as the last symbol in the transmit signal before the start of the predetermined time period.

According to an exemplary embodiment of the present invention, the communication control device is configured to insert a PWM symbol with the logical value 1 as the last symbol in the transmit signal before the start of the predetermined time period.

According to an example embodiment of the present invention, the communication control device is configured to insert a PWM symbol having the logical value 0 as the next-to-last symbol in the transmit signal before the start of the predetermined time period, and to insert a PWM symbol having the logical value 0 but not having a terminating edge as the last symbol in the transmit signal before the start of the predetermined time period.

The communication control device can be designed to check the signal at a terminal at which the transceiver device transmits a receive signal to the communication control device with regard to whether the transceiver device has switched its operating mode from the operating mode of the second communication phase to the different operating mode of the first communication phase.

According to another exemplary embodiment of the present invention, the transceiver device is designed to transmit the entire frame to the bus in the operating mode for transmitting and receiving the frame in the first communication phase.

It is possible for the frame formed for the message to be designed to be compatible with CAN FD, it being negotiated, in the first communication phase, which of the subscriber stations of the bus system is given at least temporary exclusive, collision-free access to the bus in the subsequent second communication phase.

The subscriber station described above can be part of a bus system that also includes a bus and at least two subscriber stations that are connected to each other via the bus in such a way that they can communicate with each other serially. Here, at least one of the at least two subscriber stations is a previously described subscriber station.

The object described above may be further solved by a method for communication in a serial bus system. According to an example embodiment of the present invention, the method is carried out with a subscriber station of the bus system that has a communication control device and a transceiver device, the method including the steps of controlling, with the communication control device, a communication of the subscriber station with at least one other subscriber station of the bus system such that, for a message exchanged between subscriber stations of the bus system, the bit time of a signal transmitted to the bus in the first communication phase can differ from a bit time of a signal transmitted in the second communication phase, and transmitting, with the transceiver device, the transmit signal to a bus of the bus system, the communication control device generating the transmit signal according to a frame and inserting a field having an edge into the frame after the second communication phase, and the field having, before the edge, a predetermined length corresponding to a time period that is longer than the time period of a bit time of the first communication phase, the edge being provided for synchronization to the communication on the bus for a communication control device of the at least one other subscriber station of the bus system whose transceiver device is switched, before the predetermined time period, into an operating mode for transmitting and receiving the frame in the first communication phase.

The method offers the same advantages as named above with respect to the subscriber station.

Other possible implementations of the present invention also include combinations, not explicitly mentioned, of features or specific embodiments described above or in the following with respect to the exemplary embodiments. In this context, the person skilled in the art will also add individual aspects as improvements or additions to the respective basic form of the present invention.

BRIEF DESCRIPTION OF THE DRAWINGS

The present invention is described in more detail below with reference to the figures and with reference to exemplary embodiments.

FIG. 6 through FIG. 8 show, respectively, a temporal course of a signal that occurs when a frame is transmitted at terminals of the subscriber station according to the first exemplary embodiment of the present invention when the subscriber station is the transmitter of the message.

FIG. 9 shows the temporal course of the differential voltage VDIFF of the bus signals CAN-XL_H and CAN-XL_L that results from the signals of FIG. 6 through FIG. 8.

FIG. 10 shows the temporal course of states at the receive terminal of a receiving node that result from the differential voltage VDIFF of FIG. 9.

FIG. 11 through FIG. 13 show, respectively, a temporal course of a signal that occurs when a frame is transmitted at terminals of the subscriber station according to a second exemplary embodiment of the present invention when the subscriber station is the transmitter of the message.

FIG. 14 shows the temporal course of the differential voltage VDIFF of the bus signals CAN-XL_H and CAN-XL_L that results from the signals of FIG. 11 through FIG. 13.

FIG. 15 shows the temporal course of states at the receive terminal of a receiving node that result from the differential voltage VDIFF of FIG. 14.

FIG. 16 through FIG. 18 show, respectively, a temporal course of a signal that occurs when a frame is transmitted at terminals of the subscriber station according to a third exemplary embodiment of the present invention when the subscriber station is the transmitter of the message.

FIG. 19 shows the temporal course of the differential voltage VDIFF of the bus signals CAN-XL_H and CAN-XL_L that results from the signals of FIG. 16 through FIG. 18.

FIG. 20 shows the temporal course of states at the receive terminal of a receiving node that result from the differential voltage VDIFF of FIG. 19.

In the figures, identical or functionally identical elements are provided with the same reference signs, unless otherwise indicated.

DETAILED DESCRIPTION OF EXAMPLE EMBODIMENTS

Figure 1:
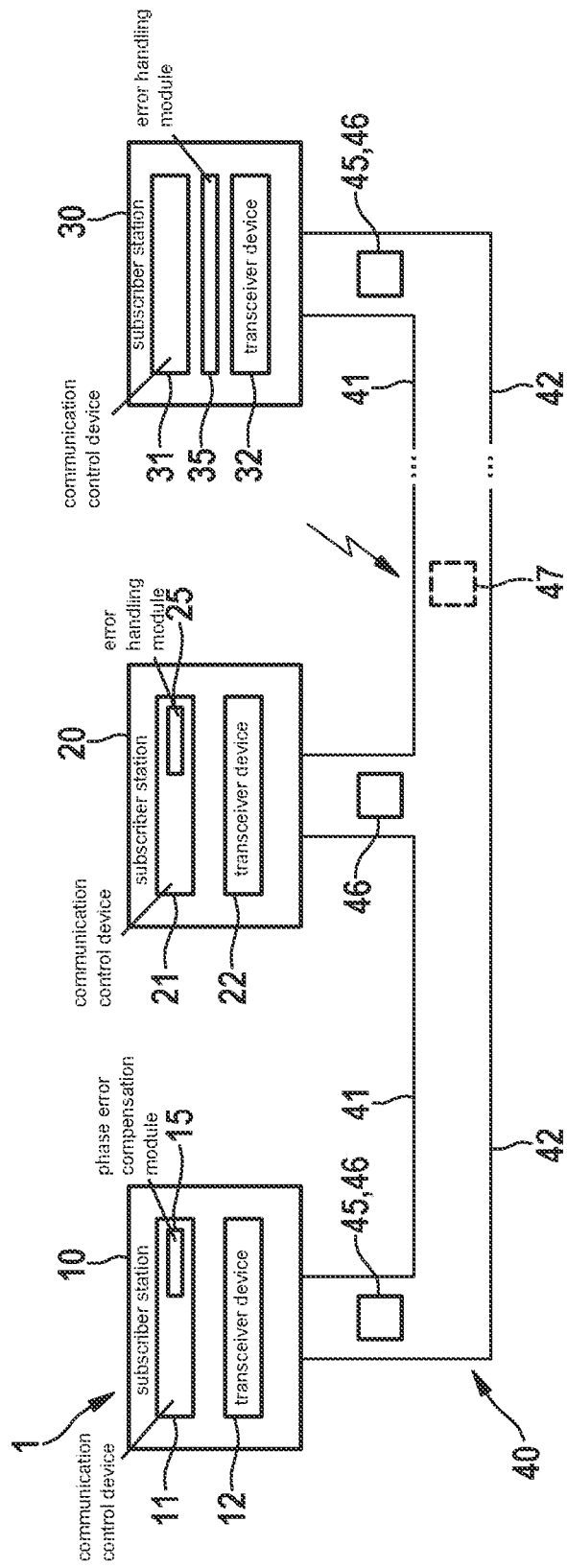
FIG. 1 shows a simplified block diagram of a bus system according to a first exemplary embodiment of the present invention.

FIG. 1 shows as an example a bus system 1, which is fundamentally designed in particular for a CAN bus system, a CAN FD bus system, a CAN XL bus system, and/or modifications thereof, as described below. Bus system 1 may be used in a vehicle, in particular a motor vehicle, an aircraft, etc., or in a hospital, etc.

In FIG. 1, bus system 1 has a multiplicity of subscriber stations 10, 20, 30, each connected to a bus 40 with a first bus wire 41 and a second bus wire 42. Bus wires 41, 42 can also be called CAN H and CAN L, or CAN-XL_H and CAN-XL_L, and are used for electrical signal transmission after coupling in of the dominant levels or generation of recessive levels or other levels for a signal in the transmit state. Messages 45, 46 in the form of signals are serially transmittable between the individual subscriber stations 10, 20, 30 via bus 40. If an error occurs during communication on the bus 40, as shown by the jagged black block arrow in FIG. 1, an error frame 47 (error flag) can optionally be sent. Subscriber stations 10, 20, 30 are for example control devices, sensors, display devices, etc. of a motor vehicle.

As shown in FIG. 1, subscriber station 10 has a communication control device 11, a transceiver device 12, and a phase error compensation module 15. Subscriber station 20 has a communication control device 21, a transceiver device 22, and optionally an error handling module 25. Subscriber station 30 has a communication control device 31, a transceiver device 32, and an error handling module 35. Transceiver devices 12, 22, 32 of subscriber stations 10, 20, 30 are each connected directly to bus 40, although this is not illustrated in FIG. 1.

Communication control devices 11, 21, 31 are each used for controlling a communication of the respective subscriber station 10, 20, 30 via bus 40 with at least one other subscriber station of the subscriber stations 10, 20, 30 connected to bus 40.

Communication control devices 11, 31 create and read first messages 45, which are for example modified CAN messages 45.

Here, the modified CAN messages 45 are constructed on the basis of a CAN XL format, which is described in more detail with reference to FIG. 2, and in which the respective error handling module 15, 35 is used. The communication control devices 11, 31 can further be realized to provide a CAN XL message 45 or a CAN FD message 46 for the transceiver device 32, or to receive it therefrom, as needed. The respective error handling modules 15, 35 are also used here. The communication control devices 11, 31 thus create and read a first message 45 or second message 46, the first and second messages 45, 46 differing in their data transmission standard, namely in this case CAN XL or CAN FD.

The communication control device 21 may be designed like a conventional CAN controller according to ISO 11898-1:2015, i.e. like a CAN FD-tolerant classical CAN controller or a CAN FD controller. In addition, error handling module 25 is optionally provided, which has the same function as error handling modules 15, 35. Communication control device 21 creates and reads second messages 46, for example CAN FD messages 46. CAN FD messages 46 can have a number of data bytes from 0 to 64, which are in addition transmitted at a significantly faster data rate than in a classical CAN message transmission. In particular, communication control device 21 is designed like a conventional CAN FD controller.

Transceiver device 22 can be designed like a conventional CAN transceiver according to ISO 11898-1:2015, or CAN FD transceiver. Transceiver devices 12, 32 can be realized to provide messages 45 according to the CAN XL format or messages 46 according to the current CAN FD format for the associated communication control device 11, 31, or to receive them therefrom, as needed.

With the two subscriber stations 10, 30, a formation and then transmission of messages 45 with the CAN XL format, and reception of such messages 45, can be realized.

Figure 2:
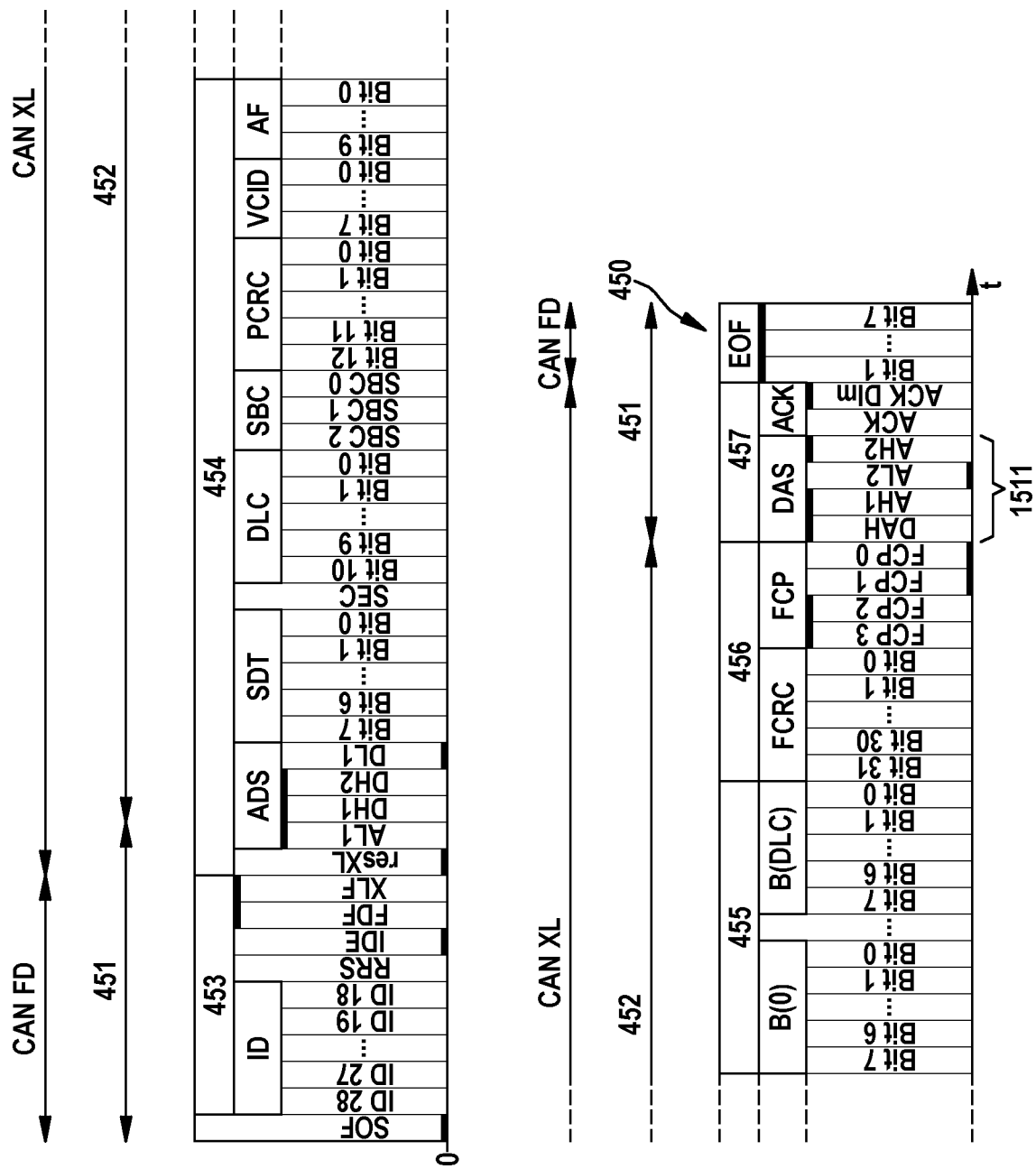
FIG. 2 shows a diagram illustrating the structure of a message that can be sent by a subscriber station of the bus system according to the first exemplary embodiment of the present invention.

FIG. 2 shows a CAN XL frame 450 for message 45, as provided by communication control device 11 for transceiver device 12 to transmit to bus 40. Here, communication control device 11 creates frame 450 in the present exemplary embodiment as compatible with CAN FD, as is also illustrated in FIG. 2. The same applies analogously to communication control device 31 and transceiver device 32 of subscriber station 30.

According to FIG. 2, CAN XL frame 450 for the CAN communication on bus 40 is divided into different communication phases 451, 452, namely an arbitration phase 451 and a data phase 452. Frame 450 has an arbitration field 453, a control field 454 having an ADS field for switching between communication phases 451, 452, a data field 455, a checksum field 456, and a frame termination field 457 in which there is a DAS field for switching between communication phases 452, 451. There then follows a frame end field EOF.

In the arbitration phase 451, an identifier (ID) with, for example, bits ID28 to ID18 in the arbitration field 453 is used to negotiate bit by bit between subscriber stations 10, 20, 30 concerning which subscriber station 10, 20, 30 wishes to send message 45, 46 with the highest priority and will therefore be given exclusive access to bus 40 of bus system 1 for the next time period for transmission in the subsequent data phase 452.

In arbitration phase 451, a physical layer is used as in CAN and CAN-FD. The physical layer corresponds to the bit transmission layer or layer 1 of the conventional OSI model (Open Systems Interconnection model).

An important point during phase 451 is that the conventional CSMA/CR method is used, which allows simultaneous access of subscriber stations 10, 20, 30 to bus 40 without destroying the higher priority message 45, 46. This makes it relatively easy to add more bus subscriber stations 10, 20, 30 to bus system 1, which is very advantageous.

The CSMA/CR method has the consequence that there have to be so-called recessive states on bus 40, which can be overwritten by other subscriber stations 10, 20, 30 with dominant states on bus 40. In the recessive state, high-impedance conditions prevail at the individual subscriber station 10, 20, 30, which, in combination with the parasitic characteristics of the bus circuitry, results in longer time constants. This causes a limitation of the maximum bit rate of the CAN-FD physical layer as used today to, currently, about 2 megabits per second in real vehicle use.

In data phase 452, the user data of the CAN-XL frame or of message 45 from data field 455, as well as the checksum field 456, are transmitted in addition to a part of control field 454.

This is followed by the DAS field, which is used to switch from data phase 452 back to data phase 451.

A sender of message 45 does not begin a transmission of bits of data phase 452 to bus 40 until subscriber station 10, as the sender, has won the arbitration and subscriber station 10, as the sender, thus has exclusive access to bus 40 of bus system 1 for the transmission.

Quite generally, the following different properties can be realized in the bus system with CAN XL compared to CAN or CAN FD:
  a) Adoption and, if necessary, adaptation of proven features responsible for the robustness and user-friendliness of CAN and CAN FD, in particular frame structure with identifier and arbitration according to the CSMA/CR method,
  b) Increasing the net data transfer rate, especially to about 10 megabits per second,
  c) Increasing the size of the useful data per frame, in particular to about 2 kbytes or any other value.

As shown in FIG. 2, in arbitration phase 451 as the first communication phase, subscriber station 10 partially uses, in particular up to the FDF bit (inclusive), a format from CAN/CAN-FD according to ISO 11898-1:2015. In contrast, starting from the FDF bit in the first communication phase as well as in the second communication phase, data phase 452, subscriber station 10 uses a CAN XL format that is described below.

In the present exemplary embodiment, CAN XL and CAN FD are compatible. Here the res bit from CAN FD, which is called XLF bit in the following, is used for the switch from the CAN FD format to the CAN XL format. Therefore, the frame formats of CAN FD and CAN XL are the same up to the res bit, or XLF bit. A receiver recognizes only at the res bit the format in which frame 450 is sent. A CAN XL subscriber station, i.e. here subscriber stations 10, 30, also supports CAN FD.

As an alternative to the frame 450 shown in FIG. 2, in which an identifier ID28 to ID18 with 11 bits is used, a CAN XL extended frame format is optionally possible in which an identifier with 29 bits is used. This is identical, up to the FDF bit, to the CAN FD extended frame format from ISO 11898-1:2015.

According to FIG. 2, frame 450 from the SOF bit up to and including the FDF bit is identical to the CAN FD base frame format according to ISO 11898-1:2015. Therefore, the conventional structure is not further explained here. Bits shown with a thick stroke at their bottom line in FIG. 2 are sent as dominant or '0' in frame 450. Bits shown with a thick stroke at their top line in FIG. 2 are sent as recessive or '1' in frame 450. In CAN XL data phase 452, symmetrical '1' and '0' levels are used instead of recessive and dominant levels.

In general, two different stuffing rules are applied when generating frame 450. Up to before the FDF bit in arbitration field 453, the dynamic bit stuffing rule of CAN FD applies, so that an inverse stuff bit is to be inserted after 5 equal bits in a row. In data phase 452 up to before the FCP field, a fixed stuffing rule applies, so that a fixed stuff bit is to be inserted after a fixed number of bits. Alternatively, instead of just one stuff bit, a number of 2 or more bits can be inserted as fixed stuff bits.

In frame 450, directly after the FDF bit there follows the XLF bit, which corresponds in position to the "res bit" in the CAN FD base frame format, as mentioned above. If the XLF bit is sent as 1, i.e. recessive, it thus identifies frame 450 as a CAN XL frame. For a CAN FD frame, communication control device 11 sets the XLF bit as 0, i.e. dominant.

The XLF bit is followed in frame 450 by a resXL bit, which is a dominant bit for future use. The resXL must be sent as 0, i.e. dominant, for frame 450. However, if subscriber station 10 receives a resXL bit as 1, i.e. recessive, the receiving subscriber station 10 goes for example into a protocol exception state, as executed for a CAN FD message 46 for a res=1.

Alternatively, the resXL bit could be defined exactly conversely, i.e. that it has to be sent as 1, i.e. recessive. In this case, the receiving subscriber station goes into the protocol exception state when there is a dominant resXL bit.

The resXL bit is followed in frame 450 by a sequence ADS (Arbitration Data Switch) in which a predetermined bit sequence is encoded. This bit sequence allows simple and safe switching from the bit rate of the arbitration phase 451 (arbitration bit rate) to the bit rate of the data phase 452 (data bit rate). For example, the bit sequence of the ADS sequence consists of an AL1 bit, which at least in the last part is sent as a logical 1. The AL1 bit is the last bit of arbitration phase 451. Within the AL1 bit, the physical layer in transceiver device 12, 22, 32 is switched over. Thus, the operating mode of transceiver 12, 32 is also switched over during the sequence ADS. The following bits DH1, DH2, and DLI are already sent with the data bit rate. Thus, in CAN XL the bits DH1, DH2, and DLI are temporally short bits of data phase 452. The ADS field is used for the transition from first communication phase 451 to second communication phase 452.

The sequence ADS is followed in frame 450 by an SDT field that identifies the content of data field 455. The content of the SDT field indicates what kind of information is contained in data field 455. For example, the SDT field indicates whether there is an "Internet Protocol" (IP) frame in data field 455, or a tunneled Ethernet frame, or something else.

The SDT field is followed by an SEC field that indicates whether frame 450 is secured with the CAN security protocol or not. The SEC field is 1 bit wide and, like the SDT field, has the function of indicating what type of information is contained in data field 455.

The SEC field is followed by a DLC field in which the data length code (DLC) is inserted, which indicates the number of data bytes in data field 455 of frame 450. The data length code (DLC) can take any value from 1 up to the maximum number of bytes of data field 455, or the data field length. If the maximum data field length is in particular 2048 bits, the data length code (DLC) requires a number of 11 bits under the assumptions that DLC=0 means a data field length with a number of 1 byte and DLC=2047 means a data field length with a number of 2048 bytes data field length. Alternatively, a data field 455 of length 0 could be allowed, as for example in CAN. Here, for example, DLC=0 would encode the data field length with the number of 0 bytes. The maximum codeable data field length with, for example, 11 bits is then $(2^{11})-1=2047$.

The DLC field is followed in frame 450 by an SBC (stuff bit count) bit counter field. This field indicates the number of dynamic stuff bits that were sent in arbitration field 453. A receiving node uses the information of the SBC bit counter field to check whether the receiving node has received the correct number of dynamic stuff bits.

Following the SBC bit counter field is a preamble checksum PCRC, also called a preface CRC. The preamble checksum PCRC is a checksum for securing the frame format of frame 450, that is, all variable bits from the beginning of frame 450 with the SOF bit to the beginning of the preamble checksum PCRC, including all the dynamic and optionally the fixed stuff bits up to the beginning of the preamble checksum PCRC. The length of preamble checksum PCRC and thus of the checksum polynomial according to the cyclic redundancy check (CRC) has to be selected according to the desired Hamming distance.

The preamble checksum PCRC is followed in frame 450 by a field VCID (Virtual CAN Bus ID). The VCID field has a length of 1 byte. The VCID field contains the number of a virtual CAN bus.

The field VCID is followed in frame 450 by a field AF (Acceptance Field). The AF field has a length of 32 bits. The AF field contains an address or some other value for an acceptance filtering.

The field AF is followed in frame 450 by data field 455 (data field). Data field 455 is made up of P bytes B, where P is encoded in the DLC field as described above. P is a natural number greater than or equal to 1.

The data field 455 is followed in frame 450 by checksum field 456 with a frame checksum FCRC and an FCP field.

The frame checksum FCRC is made up of the bits of the frame checksum FCRC. The length of frame checksum FCRC and thus of the CRC polynomial is to be selected according to the desired Hamming distance. The frame check sum FCRC secures the overall frame 450.

Alternatively, optionally only data field 455 is protected with frame checksum FCRC.

The frame check sum FCRC is followed in frame 450 by the FCP field, where FCP=Frame Check Pattern. The FCP field is made up of 4 bits having in particular the bit sequence 1100. A receive node uses the FCP field to check whether the receive node is bit-synchronous with the transmit data stream. In addition, a receiving node synchronizes to the falling edge in the FCP

FIELD

The FCP field is followed by frame termination field 457. Frame termination field 457 is made up of two fields, namely the DAS field and the acknowledgment field or ACK field with the at least one bit ACK and the bit ACK-Dlm.

The DAS field contains the sequence DAS (Data Arbitration Switch), in which a predetermined bit sequence is encoded. In FIG. 2, the predetermined bit sequence has the bits DAH, AH1, AL2, AH2. In addition, an optional bit AH2 is provided at the end of the DAS field for spacing from the acknowledgment field (ACK). The DAS field has at least three bits. The bit sequence DAH, AH1, AL2 allows simple and safe switching from the data bit rate of data phase 452 to the arbitration bit rate of arbitration phase 451. In addition, during the DAS field the operating mode of transceiver 12, 32 is optionally switched from an operating mode FAST to operating mode SLOW. For example, the bit sequence of the sequence DAS has an arbitration bit DAH and an arbitration bit AH1, each of which has the logical value 1. Within the DAH bit or the bit AH1, the physical layer, i.e. the operating mode of transceiver 12, 32, is switched from FAST_TX or FAST_RX to SLOW. Bit AH1 is followed by bit AL2 (logical 0) and bit AH2 (logical 1). The three bits DAH, AH1, AL2 have the function of ensuring the synchronization of the subscriber stations of the bus system at the end of the frame. In this way, the synchronization is also ensured of those receiving nodes that have detected an error during reception.

In the frame terminating field 457, the sequence of the DAS field is followed by the acknowledgment field (ACK). In the confirmation field, bits are provided for the confirmation or non-confirmation of a correct reception of frame 450. In the example of FIG. 2, one ACK bit and one ACK-dlm bit are provided.

Optionally, a NACK bit and a NACK-dlm bit may also be provided. The ACK bit is sent by the receiving subscriber stations 10, 30 as dominant when they have correctly received frame 450. The sending subscriber station sends the ACK bit as recessive. Therefore, the bit originally sent to bus 40 in frame 450 can be overwritten by the receiving subscriber stations 10, 30. The ACK-dlm bit is sent as a recessive bit used for separation from other fields. The NACK bit and the NACK-dlm bit are used to allow a receiving subscriber station to signal an incorrect reception of frame 450 on bus 40. The function of the bits is like that of the ACK bit and the ACK-dlm bit.

Frame termination field 457 is followed in frame 450 by an end field (EOF=End of Frame). The bit sequence of the end field (EOF) marks the end of frame 450. The end field (EOF) ensures that a number of 8 recessive bits is sent at the end of frame 450. This is a bit sequence that cannot occur within frame 450. As a result, the end of frame 450 can be reliably recognized by subscriber stations 10, 20, 30.

The end field (EOF) has a length that varies as a function of whether a dominant bit or a recessive bit was seen in the ACK bit. If the sending subscriber station has received the ACK bit as dominant, then the end field (EOF) has a number of 7 recessive bits. Otherwise, the end field (EOF) is only 5 recessive bits long.

After the end field (EOF), in the frame 450 there follows an inter frame space (IFS), which is not shown in FIG. 2. This inter frame space (IFS) is formed as in CAN FD according to ISO 11898-1:2015.

Figure 3:
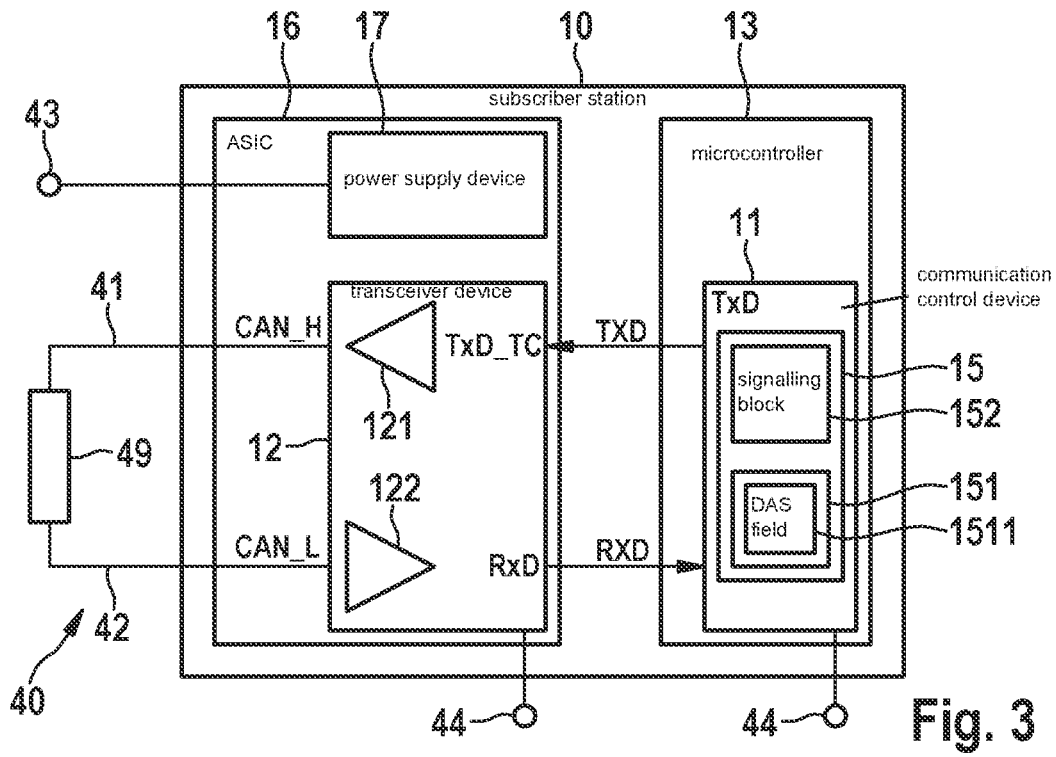
FIG. 3 shows a simplified schematic block diagram of a subscriber station of the bus system according to the first exemplary embodiment of the present invention.

FIG. 3 shows the basic structure of subscriber station 10 with communication control device 11, transceiver device 12, and error handling module 15, which is part of communication control device 11. Subscriber station 30 is constructed in manner similar to that shown in FIG. 3, but error handling module 35 according to FIG. 1 is situated separately from communication control device 31 and transceiver device 32. Therefore, subscriber station 30 is not described separately.

According to FIG. 3, subscriber station 10 has, in addition to communication control device 11 and transceiver device 12, a microcontroller 13 to which communication control device 11 is assigned, and a system ASIC 16 (ASIC=application-specific integrated circuit), which may alternatively be a system base chip (SBC) on which a plurality of functions necessary for an electronics assembly of subscriber station 10 are combined. System ASIC 16 has built into it, in addition to transceiver 12, a power supply device 17 that supplies electrical power to transceiver 12. Power supply device 17 usually supplies a voltage CAN Supply of 5 V. However, depending on requirements, power supply device 17 can supply a different voltage with a different value. In addition or alternatively, power supply device 17 may be fashioned as a current source.

Error handling module 15 has an insertion block 151 that inserts a predetermined DAS field 1511 into frame 450, and a signaling block 152. Blocks 151, 152 are described in more detail below.

Transceiver device 12 also has a transmitter module 121 and a receiver module 122. Although in the following reference is always made to transceiver device 12, it is alternatively possible to provide receiving module 122 in a separate device external to transmitting module 121. Transmitting module 121 and receiving module 122 may be constructed as in a conventional transceiver device 22. In particular, transmitter module 121 may include at least one operational amplifier and/or a transistor. In particular, receiving module 122 may include at least one operational amplifier and/or a transistor.

Transceiver 12 is connected to bus 40, more specifically its first bus wire 41 for CAN H or CAN-XL_H and its second bus wire 42 for CAN L or CAN-XL_L. The voltage supply for power supply device 17 for supplying first and second bus wires 41, 42 with electrical energy, in particular with the voltage CAN-Supply, is provided via at least one terminal 43. The connection to ground or CAN_GND is realized via a terminal 44. First and second bus wires 41, 42 are terminated with a terminating resistor 49.

In transceiver device 12, first and second bus wires 41, 42 are connected not only to transmitting module 121, which is also referred to as the transmitter, but also to receiving module 122, which is also referred to as the receiver, although the connection is not shown in FIG. 3 for simplicity.

In the operation of bus system 1, transmitting module 121 converts a transmit signal TXD or TxD of communication control device 11 into corresponding signals CAN-XL_H and CAN-XL_L for bus wires 41, 42, and transmits these signals CAN-XL_H and CAN-XL L to bus 40 at the terminals for CAN H and CAN L.

Figure 4:
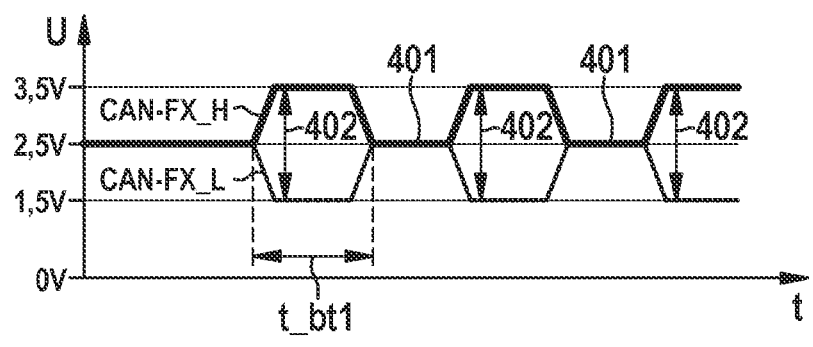
FIG. 4 shows a temporal course of bus signals CAN-XL_H and CAN-XL L at the subscriber station according to the first exemplary embodiment of the present invention.

Receiving module 122 forms a receive signal RXD or RxD from signals CAN-XL_H and CAN-XL_L received from bus 40, as shown in FIG. 4, and forwards this receive signal to communication control device 11, as shown in FIG. 3. With the exception of an idle or standby state, transceiver 12 with receiver module 122 always listens for a transmission of data or messages 45, 46 on bus 40 during normal operation, independently of whether transceiver 12 is the sender of message 45 or not.

Figure 5:
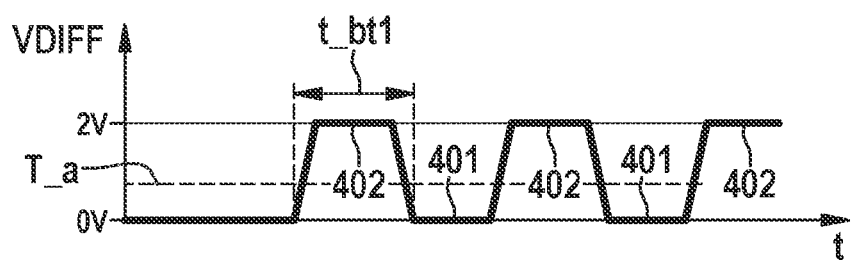
FIG. 5 shows a temporal course of a differential voltage VDIFF of the bus signals CAN-XL_H and CAN-XL_L at the subscriber station according to the first exemplary embodiment of the present invention.

According to the example of FIG. 4, the CAN-XL_H and CAN-XL_L signals have dominant and recessive bus levels 401, 402, as from CAN, at least in arbitration phase 451. A difference signal VDIFF=CAN-XL_H−CAN-XL_L is formed on bus 40, which is shown in FIG. 5 for arbitration phase 451. The individual bits of the signal VDIFF with bit time t_bt1 can be detected in arbitration phase 451 with a reception threshold T_a of for example 0.7 V.

In data phase 452, the bits of signals CAN-XL_H and CAN-XL_L are sent faster, i.e. with a shorter bit time t_bt2, than in arbitration phase 451. This is described in more detail on the basis of FIG. 6 to FIG. 10. Thus, the signals CAN-XL_H and CAN-XL L in data phase 452 differ from the conventional signals CAN H and CAN L at least in their faster bit rate.

The sequence of states 401, 402 for the signals CAN-XL_H, CAN-XL L in FIG. 4 and the resulting course of the voltage VDIFF in FIG. 5 are provided only to illustrate the function of subscriber station 10. The sequence of the data states for bus states 401, 402 can be selected as needed.

In other words, according to FIG. 4, when the transmitter module 121 is switched to a first operating mode B_451 (SLOW), it generates a first data state as bus state 402 with different bus levels for two bus wires 41, 42 of the bus line and a second data state as bus state 401 with the same bus level for the two bus wires 41, 42 of the bus line of bus 40.

Furthermore, for the time courses of the signals CAN-XL_H, CAN-XL_L, in a second operating mode B_452_TX (FAST_TX) that comprises data phase 452, transmit module 121 transmits the bits to bus 40 with a higher bit rate. The CAN-XL_H and CAN-XL_L signals can in addition be generated in data phase 452 with a different physical layer than in CAN FD. In this way, the bit rate in data phase 452 can be increased still further than with CAN FD. A subscriber station that is not a transmitter of frame 450 in data phase 452 sets a third operating mode B_452_RX (FAST_RX) in its transceiver device.

To signal the switchover from operating mode B_451 to operating mode B_452_TX (FAST_TX) or operating mode B_452_RX (FAST_RX), communication control device 11 carries out a pulse width modulation (PWM) of the transmit signal TxD. For this purpose, communication control device 11 uses one or more PWM symbols per logical bit of CAN XL frame 450. Basically, a PWM symbol is made up of two phases, namely a 0-phase and a 1-phase. Moreover, a PWM symbol is bounded by two equal edges, for example by two rising edges.

Error handling module 15 of FIG. 3, in particular its insertion block 151, is used to insert DAS field 1511 into frame 450 when subscriber station 10 acts as sender of frame 450. In addition, error handling module 15, in particular its signaling block 152, can perform pulse width modulation (PWM) as described below for switching between the operating modes B_452_TX (SLOW) and B_451 (SLOW).

FIG. 6 shows, over time t, the resulting digital transmit signal TxD in the region at the end of data phase 452 of a frame 450. DAS field 1511 is inserted into frame 450 after the bits FCP3 through FCP0. Transmit signal TxD is transmitted serially by communication control device 11 as the transmitter of frame 450 to transceiver device 12, as described in more detail below. Up to bit DAH, the bits of frame 450 have a bit duration t_bt2.

Starting from bit DAH, the bits of frame 450 have a bit duration t_bt1. Bit duration t_b2 is shorter than bit duration t_bt1 in the example of FIG. 6.

FIG. 7 shows the states resulting over time t from the transmit signal TxD, which occur serially at the TXD terminal between communication control device 11 and transceiver device 12. For this purpose, communication control device 11, for example error handling module 15, in particular signaling block 152, carries out the pulse width modulation (PWM) of transmit signal TxD of FIG. 6 in data phase 452. In the example in FIG. 7, for a PWM symbol SB_D0 the 0 phase is longer than the 1 phase, which corresponds to a bit with logical value 0 in transmit signal TxD. In contrast, for a PWM symbol SB_D1 the 1-phase is longer than the 0-phase, which corresponds to a bit with logical value 1. Of course, the PWM symbols SB_D0, SB_D1 can be defined differently, in particular exactly conversely to the above description. After the data phase 452, the pulse width modulation (PWM) of the transmit signal TxD ends, as shown in FIG. 6. In arbitration phase 451, no pulse width modulation (PWM) of the transmit signal TxD takes place. The switchover from operating mode B_452_TX (FAST_TX) or operating mode B_452_RX (FAST_RX) FAST_RX to operating mode B_451 (SLOW) is signaled by shutting off the PWM coding and thus by the absence of the many edges.

At the end of arbitration phase 451, transceiver 12 detects, based on the high frequency of the edges of transmit signal TxD, that transceiver 12 should change from operating mode B_451 of the arbitration phase to one of the fast operating modes B_452_TX (FAST_TX), B_452_RX (FAST_RX), or should remain there.

By the value of the first PWM symbol or of the M first symbols, transceiver 12 recognizes whether it is to switch to the operating mode B_452_TX (FAST_TX) or the operating mode B_452_RX (FAST_RX). M is a natural number greater than or equal to 1.

FIG. 8 shows the time course of a signal TxD_TC decoded by transceiver 12 from the states at terminal TXD in FIG. 7. In addition, FIG. 8 shows the operating state of transceiver device 12. Transceiver device 12 switches its operating mode B_452_TX, in which the frame has 450 bits with bit duration t_bt2, in bit DAH to operating mode B_451, in which frame 450 has bits with bit duration t_bt1. In addition, the bits of frame 450 in operating mode B_451 can be sent to bus 40 with a different physical layer than in operating mode B_452_TX, as described above. Transceiver device 12 can detect, in particular with an RC element, after a predetermined time period T_TO (TimeOut) has elapsed, that no edges have arrived for the predetermined time T_TO. If transceiver 12 detects the elapsing of the predetermined time period T_TO (TimeOut), transceiver 12 switches to its operating mode B_451 (SLOW).

Thus, transceiver 12 decodes the states at terminal TXD of FIG. 7 into signal TxD_TC according to FIG. 8. Each of the PWM symbols SB_D0, SB_D1 at terminal TXD can be decoded only at the end of the respective PWM symbol SB_D0, SB_D1. Thus, the decoding in transceiver device 12 inserts an additional delay period T_VZ into signal TxD_TC that is to be transmitted serially to bus 40. The delay time duration T_V2 is equal to the time duration of a symbol length of one of the PWM symbols SB_D0, SB_D1, as shown in FIG. 8.

After transceiver 12 has decoded the states at terminal TXD of FIG. 7 into the signal TxD_TC according to FIG. 8, transceiver 12 transmits signal TxD_TC to bus 40 as differential voltage VDIFF, shown in FIG. 9.

FIG. 10 shows, over time t, the course of the signal at the RXD terminal of transceiver 12. Transceiver 12 transmits receive signal RxD as 1 via the RXD terminal as long as transceiver 12 is in the operating mode B_452_TX. This period of time, in which the transceiver 12 is in the operating mode B_452_TX, corresponds to a period of time T_S, the end of which is shown schematically in FIG. 10. In the operating mode B_452_TX (FAST_TX), RXD=1. In the operating mode B_452, transceiver 12 transmits the states via the RXD terminal that correspond to the states of the digital receive signal RxD that transceiver 12 has generated from the differential voltage VDIFF received from bus 40.

Thus, as shown in FIG. 6 to FIG. 10, in the present embodiment, the error handling module 15 of FIG. 3 is designed such that the DAS field has two bits (DAH, AH1) with value 1 followed by one bit (AL2) with value 0 (dominant).

The DAH bit is a transition bit in the DAS field 1151. The DAH bit is transmitted by the transmitting node or by transceiver device 12 with recessive level at least in the last part. The transmitting node is a subscriber station that is the transmitter of frame 450 in the current data phase 452, and thus transmits frame 450 to bus 40. In the following, it is assumed that subscriber station 10 is the transmitting node for frame 450 and subscriber station 30 is a receiving node.

In subscriber station 10 as the transmitting node for frame 450, communication control device 11 signals with the beginning of the DAH bit that transceiver 12 is to switch its operating mode from B_452_TX (FAST_TX) to B_451 (SLOW). For example, the beginning of the DAH bit corresponds to up to 50% of the DAH bit. Based on this signaling in the DAH bit, transceiver 12 carries out the switching of its operating mode from B_452_TX (FAST_TX) to B_451 (SLOW) after the predetermined time T_TO has elapsed, as shown in FIG. 7 and FIG. 8. During the time period T_TO, the bus level according to FIG. 9, i.e. the value of VDIFF, is not reliably recessive.

According to FIG. 6 and FIG. 7, subscriber station 10, as the transmitting node, more precisely transceiver 12, for frame 450 transmits the DAH bit in the last part with recessive level. The last part, for example, also corresponds to 50%. Subsequently, subscriber station 10 transmits the AH1 bit completely, with recessive level. Subsequently, subscriber station 10 transmits the AL2 bit completely, with dominant level. Thus, a recessive bus state is formed on bus 40 for a predetermined time period T_RB. In the example from FIG. 6 to FIG. 9, predetermined time duration T_RB corresponds to a number of 1.5 bits with bit duration t_bt1.

Thus, according to FIG. 6 to FIG. 10, the FCP0 bit is the last bit to be transmitted to transceiver 12 encoded by PWM symbol. During the DAH bit, communication control device 11, in particular error handling module 15, transmits the TxD signal as 1. Because the FCP0 bit has logical 0 as its value, this is driven to bus 40 by device 12 as a differential voltage with the value+1 V. Transceiver 12 detects, after time period T_TO (TimeOut) of for example 500 ns or some other value, that no edges occur at terminal TXD. Therefore, transceiver 12 switches its operating mode to B_451 (SLOW), as shown in FIG. 8. Since there is a 1 on the TxD signal, transceiver 12 now drives a recessive level to bus 40. The subsequent AH1 bit is also driven to bus 40 with recessive level. Thus, immediately before the AL2 bit the transmitting node generates a recessive level with duration T_RB, which is significantly longer than an arbitration bit time t_bt1.

As a result, the DAS field includes a bit sequence 110 that provides a safe synchronization edge before switching from data phase 452 to arbitration phase 451. In this way, it can be ensured that each receiving node, i.e. a subscriber station that is not the sender of frame 450 in the current data phase 452 and therefore is only the receiver of frame 450, has seen a recessive level for the duration t_bt1 of at least one arbitration bit immediately before the falling edge of the AL2 bit (dominant) in the DAS field. This holds even if the bits arrive at the receiver in shortened form, which can occur due to the effect of bit asymmetry. Bit asymmetry occurs due to non-ideal components such as transceivers 12, 22, 32, terminating resistors, stubs, etc. Thus, each receiving node sees at least one recessive bit before the edge between AH1 and AL1, which is a necessary precondition for a synchronization.

This allows an error handling in which a receiving node does not send an error frame 47, but rather in which the receiving node, if it has seen an error, proceeds as follows. If an error is seen, the receiving node, for example subscriber station 30, switches its transceiver 32 to the operating mode arbitration phase 451 (SLOW operating mode) if transceiver 32 was not previously already in this mode, and waits for the bus idle sequence made up of 11 recessive bits of arbitration phase 451, as previously described. The DAS field with bit sequence 110 then provides the required safe synchronization edge before the start of the bus idle sequence.

According to a modification of the present exemplary embodiment, communication control device 11, for example error handling module 15, in particular signaling block 152, does not signal to transceiver 12 that transceiver 12 is to be switched to operating mode B_452_TX (FAST_TX). Alternatively, in subscriber station 10 for communication control device 11 there may be a transceiver, in particular a transceiver 22, that does not have an operating mode B_452_TX (FAST_TX) or B_452_RX (FAST_RX). In these two alternatives, the transmitting node sends the DAH bit as a recessive bit because it is a logical 1.

For this modification and its alternative as well, it is ensured that each receiving node has seen a recessive level immediately before the falling edge of the AL2 bit (dominant) in the DAS field for at least the duration t_b1, which is the duration of an arbitration bit.

FIG. 11 through FIG. 15 show time courses according to a second exemplary embodiment, which differ from the time courses of FIG. 6 through FIG. 10 in the following aspects.

As shown in FIG. 12, at the beginning of the DAH bit at least one PWM symbol is sent that corresponds to the logical value 1. In the example of FIG. 12, the PWM symbol SB_D1 is sent. For this purpose, communication control device 11, for example error handling module 15, in particular signaling block 152, carries out a corresponding pulse width modulation (PWM) of the DAH bit. Subsequently, communication control device 11, for example error handling module 15, in particular signaling block 152, transmits the TxD signal as 1 during the DAH bit.

Because the PWM symbol for the logical 1 was sent last, the signal TxD_TC of FIG. 13 is already also logical 1 at the beginning of the DAH bit. Thus, the differential voltage VDIFF has a value −1V for the time duration T_TO (TimeOut) (FIG. 12) of the DAH bit, as shown in FIG. 14.

Transceiver 12 detects, after time period T_TO (TimeOut) (FIG. 12) of for example 500 ns or some other value, that no edges occur at terminal TXD. Therefore, transceiver 12 switches its operating mode to B_451 (SLOW), as shown in FIG. 13. Since there is a 1 on the TxD signal, transceiver 12 now drives a recessive level to bus 40. The subsequent AH1 bit is also driven to bus 40 with recessive level.

Thus, in the present exemplary embodiment as well the transmitting node generates a recessive level immediately before the AL2 bit that is significantly longer than an arbitration bit time t_bt1.

In all other respects, the functioning of bus system 1 of the two exemplary embodiments is the same.

FIG. 16 through FIG. 20 show time courses according to a third exemplary embodiment, which differ from the time courses of FIG. 6 through FIG. 10 in the following aspects.

As shown in FIG. 17, communication control device 11, for example error handling module 15, in particular signaling block 152, sends a PWM symbol at the beginning of the DAH bit that corresponds to the logical value 0 but has no terminating edge. Here, in the example of FIG. 17 the PWM symbol SB_D0 is sent without the terminating edge. Subsequently, communication control device 11, for example error handling module 15, in particular signaling block 152, transmits the TxD signal as 0 until transceiver 12 has switched or changed its operating mode to B_451 (SLOW) during the DAH bit, as shown in FIG. 18.

Transceiver 12 detects, after time period T_TO (TimeOut) (FIG. 17) of for example 500 ns or some other value, that no edges occur at terminal TXD. Therefore, transceiver 12 switches its operating mode to the operating mode B_451 (SLOW), as shown in FIG. 18. Since the signal at terminal TXD shown in FIG. 17 still has the value 0 at this time, transceiver 12 drives a dominant level to bus 40. Therefore, differential voltage VDIFF has the value+2V, as shown in FIG. 19.

Operating mode B_451 (SLOW) is detected by communication control device 11, for example error handling module 15, in particular signaling block 152, based on the value at the RXD terminal, as shown in FIG. 20. In operating mode B_452_TX (FAST_TX) RXD=1 as indicated by the time period T_S in FIG. 20. In operating mode B_451 (SLOW), the value at the RXD terminal is the logical value of differential voltage VDIFF on bus 40, as shown in FIG. 19 and FIG. 20.

As soon as communication control device 11, for example error handling module 15, in particular signaling block 152, detects from the value of RXD (RXD=0) that transceiver 12 is switched to operating mode B_451 (SLOW), communication control device 11, for example error handling module 15, in particular signaling block 152, transmits the TxD signal according to FIG. 16 at the TXD terminal according to FIG. 17 for the rest of the DAH bit as 1. The subsequent AH1 bit is also driven to bus 40 with recessive level.

Thus, in the present exemplary embodiment as well the transmitting node generates a recessive level immediately before the AL2 bit that is significantly longer than an arbitration bit time t_bt1.

In all other respects, the functioning of bus system 1 is the same as that of the other exemplary embodiments.

The three embodiments differ, inter alia, in the differential voltage VDIFF from which the transition to the differential voltage VDIFF=0 for the recessive level takes place. Here there are 3 possibilities for the case in which the operating mode switchover of the transceiver is used, because in addition to the recessive level of differential voltage VDIFF=0 there exist three more: VDIFF=+2V for dominant, VDIFF=+1V for logical 0 in the data phase, and VDIFF=−1V for logical 1 in data phase 452. All of the exemplary embodiments described above of subscriber stations 10, 20, 30, of bus system 1, and of the method carried out therein may be used individually or in all possible combinations. In particular, all features of the exemplary embodiments described above and/or modifications thereof may be combined in any manner desired. In addition or alternatively, in particular the following modifications are possible.

Although the invention is described above using the CAN bus system as an example, the present invention can be used in any communication network and/or communication method in which two different communication phases are used in which the bus states generated for the different communication phases differ. In particular, the invention can be used in developments of other serial communication networks, such as Ethernet and/or 100 Base-T1 Ethernet, field bus systems, etc.

In particular, bus system 1 according to the exemplary embodiments can be a communication network in which data can be transmitted serially with two different bit rates. It is advantageous, but not a necessary condition, that an exclusive, collision-free access of a subscriber station 10, 20, 30 to a common channel is ensured in bus system 1 at least for certain periods of time.

Of course, the DAS field can have more than the three bits described in the three exemplary embodiments. Here it is only required that the field (DAS) has, before the edge, a predetermined length with a time duration T_RB that is longer than the time duration of a bit time t_bt1 of arbitration phase 451 (first communication phase). Preferably, the time duration T_RB is equal to or greater than the time duration of 1.5 bits of arbitration phase 451, as described above.

The number and configuration of subscriber stations 10, 20, 30 in bus system 1 of the exemplary embodiments is arbitrary. In particular, subscriber station 20 may be omitted in bus system 1. It is possible for one or more of subscriber stations 10 or 30 to be present in bus system 1. It is possible for all subscriber stations in bus system 1 to have the same design, i.e. only subscriber station 10 or only subscriber station 30 are present.

What is claimed is:

1. A subscriber station for a serial bus system, comprising:
a communication control device configured to control a communication of the subscriber station with at least one other subscriber station of the bus system and to generate a transmit signal, so that, for a message exchanged between subscriber stations of the bus system, a bit time of a signal transmitted to the bus in a first communication phase can differ from a bit time of a signal transmitted in the second communication phase;
wherein the communication control device is configured to generate the transmit signal for the message according to a frame and to insert a field with an edge into the frame after the second communication phase, the field having, before the edge, a predetermined length corresponding to a predetermined time period that is longer than a time duration of the bit time of the first communication phase; and
wherein the edge is provided for synchronization to the communication on the bus for a communication control device of the at least one other subscriber station of the bus system, whose transceiver device is switched, before the predetermined time period, to an operating mode for transmitting and receiving the frame in the first communication phase.

2. The subscriber station as recited in claim 1, wherein the predetermined length of the field has at least three bits with the bit time of the first communication phase.

3. The subscriber station as recited in claim 1, wherein the edge is a falling edge.

4. The subscriber station as recited in claim 1, wherein the communication control device is configured to insert a bit sequence having a logical value 11 in the field before the edge.

5. The subscriber station as recited in claim 1, wherein the communication control device is configured to insert the field as a bit sequence having the logical value 1101.

6. The subscriber station as recited in claim 1, wherein the communication control device is configured to signal to the transceiver device by pulse width modulation in the transmit signal that the transceiver device has to switch its operating mode.

7. The subscriber station as recited in claim 1, further comprising:
a transceiver device configured to transmit the transmit signal to a bus of the bus system, the transceiver device of the subscriber station being configured to switch its operating mode from an operating mode of the second communication phase to a different operating mode of the first communication phase after an elapsing of a predetermined time period in which the transceiver device of the subscriber station has not received any edges in the transmit signal.

8. The subscriber station as recited in claim 7, wherein the communication control device is configured to insert a PWM symbol with a logical value 0 as a last symbol in the transmit signal before the start of the predetermined time period.

9. The subscriber station as recited in claim 7, wherein the communication control device is configured to insert a PWM symbol with a logical value 1 as a last symbol in the transmit signal before the start of the predetermined time period.

10. The subscriber station as recited in claim 7, wherein the communication control device is configured to insert a PWM symbol having a logical value 0 as a next-to-last symbol in the transmit signal before the start of the predetermined time period, and to insert a PWM symbol having a logical value 0 but not having a terminating edge as a last symbol in the transmit signal before the start of the predetermined time period.

11. The subscriber station as recited in claim 7, wherein the communication control device is configured to check a signal at a terminal at which the transceiver device of the subscriber station transmits a receive signal to the communication control device with regard to whether the transceiver device of the subscriber station has switched its operating mode from the operating mode of the second communication phase to the different operating mode of the first communication phase.

12. The subscriber station as recited in claim 1, further comprising:
a transceiver device configured to transmit the transmit signal to a bus of the bus system, the transceiver device being configured to transmit the frame in its entirety to the bus in an operating mode for transmitting and receiving the frame in the first communication phase.

13. The subscriber station as recited in claim 1, wherein the frame formed for the message is constructed to be compatible with CAN FD, and it being negotiated in the first communication phase which of the subscriber stations of the bus system receives an at least temporarily exclusive, collision-free access to the bus in a subsequent second communication phase.

14. A bus system, comprising:
   a bus; and
   at least two subscriber stations that are connected to one another via the bus in such a way that they can communicate with each other serially and of which at least one subscriber station includes:
      a communication control device configured to control a communication of the subscriber station with at least one other subscriber station of the bus system and to generate a transmit signal, so that, for a message exchanged between subscriber stations of the bus system, a bit time of a signal transmitted to the bus in a first communication phase can differ from a bit time of a signal transmitted in the second communication phase,
      wherein the communication control device is configured to generate the transmit signal for the message according to a frame and to insert a field with an edge into the frame after the second communication phase, the field having, before the edge, a predetermined length corresponding to a predetermined time period that is longer than a time duration of the bit time of the first communication phase, and
      wherein the edge is provided for synchronization to the communication on the bus for a communication control device of the at least one other subscriber station of the bus system, whose transceiver device is switched, before the predetermined time period, to an operating mode for transmitting and receiving the frame in the first communication phase.

15. A method for communication in a serial bus system, the method being carried out with a subscriber station of the bus system that has a communication control device and a transceiver device, the method comprising the following steps:
   controlling, with the communication control device, a communication of the subscriber station with at least one other subscriber station of the bus system so that, for a message exchanged between subscriber stations of the bus system, a bit time of a signal transmitted to the bus in a first communication phase can differ from a bit time of a signal transmitted in the second communication phase; and
   transmitting, using the transceiver device, a transmit signal formed for the message to a bus of the bus system, the communication control device generating the transmit signal according to a frame and inserting a field with an edge into the frame after the second communication phase, the field having, before the edge, a predetermined length corresponding to a predetermined time period that is longer than a time duration of the bit time of the first communication phase, and the edge being provided for synchronization to the communication on the bus for a communication control device of the at least one other subscriber station of the bus system, whose transceiver device is switched, before the predetermined time period, to an operating mode for transmitting and receiving the frame in the first communication phase.

\* \* \* \* \*